(12) United States Patent
Singh et al.

(10) Patent No.: US 12,267,002 B2
(45) Date of Patent: Apr. 1, 2025

(54) SHUNT VOLTAGE TO DIGITAL POWER SEQUENCE CONVERSION WITH AUTO-CALIBRATED TRANSCONDUCTOR, ERROR CANCELLING REFERENCE AND CURRENT TO POWER CONVERTER

(71) Applicant: Analog Devices International Unlimited Company, Limerick (IE)

(72) Inventors: Gaurav Singh, Lucknow (IN); Supantha Sen, Kolkata (IN)

(73) Assignee: Analog Devices International Unlimited Company, Limerick (IE)

( * ) Notice: Subject to any disclaimer, the term of this patent is extended or adjusted under 35 U.S.C. 154(b) by 909 days.

(21) Appl. No.: 17/391,868

(22) Filed: Aug. 2, 2021

(65) Prior Publication Data
US 2023/0037712 A1    Feb. 9, 2023

(51) Int. Cl.
*H02M 1/32* (2007.01)
*H02M 1/08* (2006.01)
*H02M 3/158* (2006.01)

(52) U.S. Cl.
CPC .............. *H02M 1/32* (2013.01); *H02M 1/08* (2013.01); *H02M 3/158* (2013.01)

(58) Field of Classification Search
CPC .......... B60L 53/11; B60L 53/63; B60L 53/67; H03F 3/45; G01R 21/06; G01R 21/127; G01R 21/203
See application file for complete search history.

(56) References Cited

U.S. PATENT DOCUMENTS

| | | | |
|---|---|---|---|
| 4,038,695 | A | 7/1977 | Depuy |
| 4,782,422 | A | 11/1988 | Jones et al. |
| 5,019,936 | A | 5/1991 | Zylstra et al. |

(Continued)

FOREIGN PATENT DOCUMENTS

| | | |
|---|---|---|
| CN | 115144776 | 10/2022 |
| EP | 1563608 | 12/2011 |

(Continued)

OTHER PUBLICATIONS

"U.S. Appl. No. 17/219,025, Non Final Office Action mailed Sep. 14, 2022", 12 pgs.

(Continued)

*Primary Examiner* — David V Henze-Gongola
(74) *Attorney, Agent, or Firm* — Schwegman Lundberg & Woessner, P.A.

(57) ABSTRACT

A device to convert a detected voltage, that is indicative of current conducted by a switching circuit, to a series of electrical pulses that is indicative of electrical power dissipated by the switching circuit responsive to the current. The device includes a transconductor circuit including a first circuit to receive a reference current and a first reference voltage, and to obtain a transconductance based on an auto-generated bias current and the reference current and the first reference voltage, where a value of the transconductance is determined by the reference current and the first reference voltage. The transconductor circuit further includes a second circuit coupled to the first circuit to receive the detected voltage, and to generate a first current based on the detected voltage and the obtained transconductance.

20 Claims, 5 Drawing Sheets

(56) References Cited

U.S. PATENT DOCUMENTS

| | | | |
|---|---|---|---|
| 5,444,590 A | 8/1995 | Lecomte et al. | |
| 5,598,086 A | 1/1997 | Somerville | |
| 5,723,915 A | 3/1998 | Maher et al. | |
| 7,015,702 B2 | 3/2006 | Rupp | |
| 7,126,509 B2 | 10/2006 | Sit et al. | |
| 7,352,166 B1 | 4/2008 | Blom | |
| 7,714,757 B2 | 5/2010 | Denison et al. | |
| 8,299,767 B1 | 10/2012 | Tuozzolo et al. | |
| 8,897,727 B2 | 11/2014 | Wang et al. | |
| 9,520,772 B2 | 12/2016 | He et al. | |
| 9,621,043 B2 | 4/2017 | Kimura et al. | |
| 9,634,481 B2 | 4/2017 | Eddleman et al. | |
| 10,191,453 B2 | 1/2019 | Pavlovic et al. | |
| 10,374,444 B2 | 8/2019 | Worry et al. | |
| 10,819,290 B2 | 10/2020 | Ranta et al. | |
| 11,632,105 B2 | 4/2023 | Singh et al. | |
| 2004/0263089 A1 | 12/2004 | Contenti et al. | |
| 2010/0046123 A1 | 2/2010 | Fukami | |
| 2010/0194481 A1* | 8/2010 | Hase | H03G 3/3042 330/310 |
| 2013/0293139 A1 | 11/2013 | Sadwick et al. | |
| 2015/0069958 A1* | 3/2015 | Yang | H02J 7/007 320/137 |
| 2016/0048197 A1 | 2/2016 | Hanssen et al. | |
| 2016/0077135 A1 | 3/2016 | Jöckel et al. | |
| 2016/0218501 A1* | 7/2016 | Eddleman | H01C 1/16 |
| 2017/0356939 A1 | 12/2017 | Hurwitz et al. | |
| 2018/0252748 A1 | 9/2018 | Wood et al. | |
| 2020/0256894 A1 | 8/2020 | Zhang et al. | |
| 2020/0343885 A1 | 10/2020 | Braun | |
| 2022/0321114 A1 | 10/2022 | Singh et al. | |

FOREIGN PATENT DOCUMENTS

| | | |
|---|---|---|
| EP | 3700038 | 8/2020 |
| JP | 2006191564 | 7/2006 |
| WO | 9012438 | 10/1990 |
| WO | 2016138807 | 9/2016 |

OTHER PUBLICATIONS

"U.S. Appl. No. 17/219,025, Response filed Nov. 14, 2022 to Non Final Office Action mailed Sep. 14, 2022", 10 pgs.

"European Application Serial No. 22161512.3, Extended European Search Report mailed Dec. 5, 2022", 10 pgs.

"European Application Serial No. 22182916.1, Extended European Search Report mailed Dec. 6, 2022", 10 pgs.

Palani, Ramesh, "Design of PVT Tolerant Inverter Based Circuits for Low Supply Voltages", PhD diss. U. of Minnesota, (Jun. 2015), 210 pgs.

"European Application Serial No. 22161512.3, Response filed Jun. 29, 2023 to Extended European Search Report mailed Dec. 5, 2022", 21 pgs.

"European Application Serial No. 22182916.1, Communication Pursuant to Article 94(3) EPC mailed May 8, 2024", 6 pgs.

"European Application Serial No. 22182916.1, Response filed Aug. 2, 2024 to Communication Pursuant to Article 94(3) EPC mailed May 8, 2024", 14 pgs.

"Chinese Application Serial No. 202210183307.4, Office Action mailed Jan. 23, 2025", w/ English machine translation, 14 pgs.

* cited by examiner

SHUNT VOLTAGE TO DIGITAL POWER SEQUENCE CONVERSION WITH AUTO-CALIBRATED TRANSCONDUCTOR, ERROR CANCELLING REFERENCE AND CURRENT TO POWER CONVERTER

FIELD OF THE DISCLOSURE

This document pertains generally, but not by way of limitation, to electronic circuits, more particularly, to battery management systems.

BACKGROUND

Electric or hybrid electric vehicles typically include one or more battery modules, or other portable power supplies, that are configured to provide electrical power to systems of the vehicle. In an example, an electric vehicle can include a set of one or more battery modules that are coupled in series to provide electrical power at a specified voltage, such as a voltage in the range of 30-600 volts, to power or actuate an electric drive motor or other drive train system of the vehicle. The battery modules may be associated with a battery management system (BMS) that is configured to protect the battery modules from damage by controlling, such as by limiting or regulating, the power drawn from the modules, such as a during operation of an electrical vehicle. In an example, a BMS can include control circuitry that limits the amount of current that is drawn from a battery module by the drive train system of an electric vehicle. The control circuitry can interrupt the current drawn from the battery module when current, or power associated with the current, exceeds a safe operating range of one or more components of the system.

Figure 1:
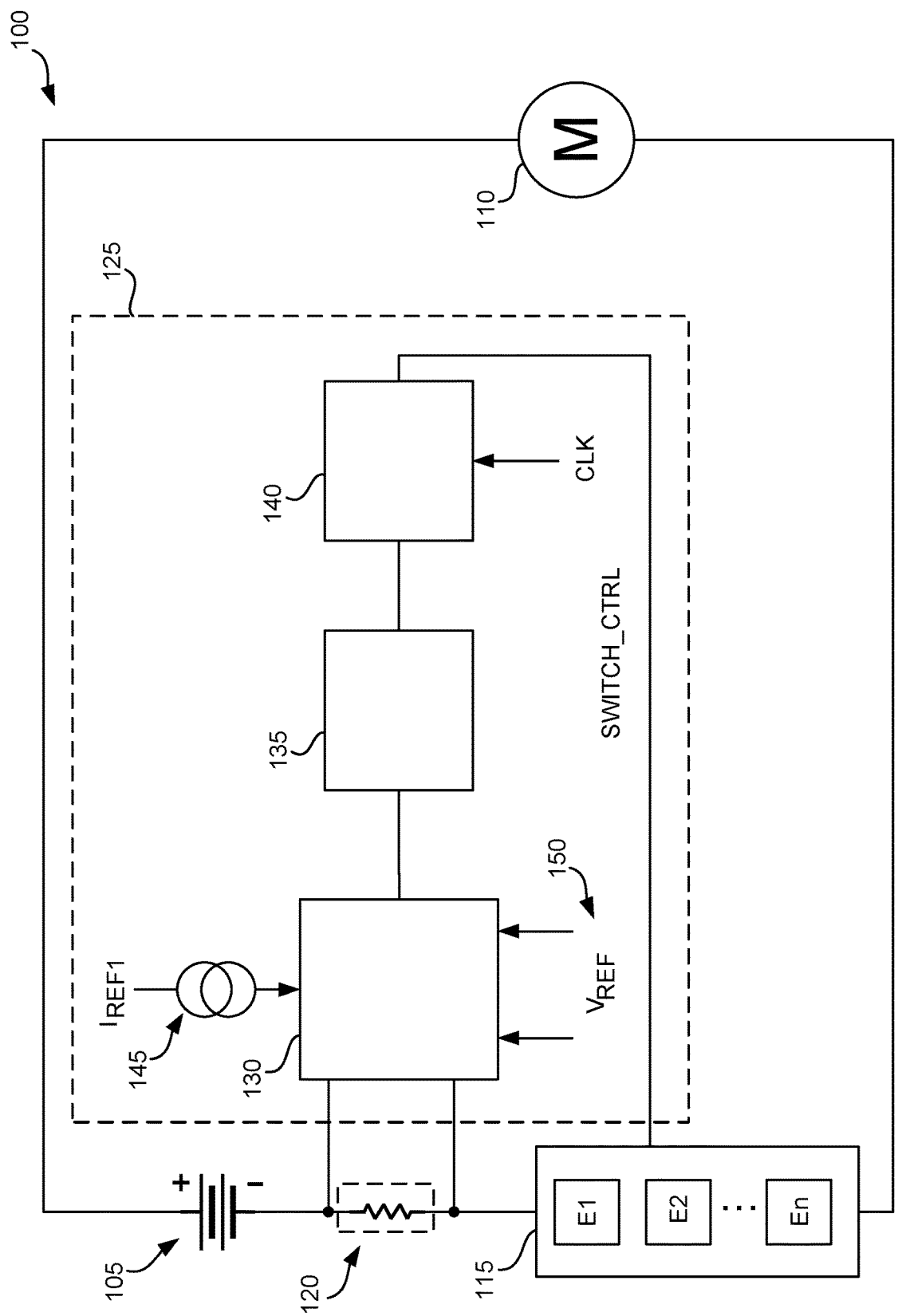
FIG. 1 illustrates an example of a battery management system.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Aspects of the present disclosure include techniques of controlling switching devices in a battery management systems, such as a BMS that is used in an electric vehicle to provide power from a battery module to a load (e.g., a vehicle motor) through operation of one or more solid state switching devices, such as one or more power gates. These techniques include converting a sensed voltage, such as a voltage developed across shunt resistor that is used in a BMS to sense current drawn from a battery module, to a series of electrical pulses, where a count of these pulses over time is indicative of cumulative thermal energy or average thermal power that is dissipated in a BMS switching device during that time. The cumulative thermal energy in the switching device may be indicative of the current or instantaneous junction temperature of the switching device. The resultant series of electrical pulses can be combined with a suitable algorithm and used to break the electrical current path in a BMS by controlling the switching device when the heat dissipated inside the switching device exceeds a safe operating range of a protected battery module or power supply. This can inhibit or limit damage to switching devices due to cumulative heating caused by excessive operation or drawn current and may protect other system components, such as the battery module or an electric motor, from operating under unsafe currents. These techniques enable BMS's for high voltage devices to be fabricated using solid state switches as the primary switching devices for controlling power delivered to a load. The costs of these systems can be reduced due to the use of solid-state devices rather than mechanical switches. Additionally, reliability and the response time can be improved by controlling operation of the switching devices based on cumulative energy dissipated by the devices.

FIG. 1 illustrates an example of a battery management system 100. As shown in FIG. 1, the BMS 100 includes battery module 105, load 110, switching circuitry 115, sense device 120, and monitor circuitry 125.

Battery module 105 can include a set of one or more electrochemical or solid-state battery cells that are configured to provide electrical power to a system. In an example, battery module 105 includes a set of one or more battery modules that are arranged to provide electrical power at an indicated output voltage, such as 30 to 600V volts (V).

Load 110 includes electric or electromechanical circuitry that is configured to be actuated by electrical power provided by the battery module 105. In an example, load 110 is an electric motor, such as a DC motor used to provide mechanical power in the drive train of an electric vehicle.

Switching circuitry 115 includes an electronic or electromechanical device that is configured to provide controlled or regulated electrical power from a power source, such as battery module 105, to drive or actuate a load, such as load 110. In an example, switching circuitry 115 includes one or more semiconductor devices, such as power field effect transistors (FETs), power diodes, power bipolar junction transistors that are arranged to conduct current from the battery module 105 to the load 110. In another example, switching circuitry 115 includes at least one control signal, such as SWITCH_CTRL, that actuates the switching circuitry to control (e.g., limit or regulate) electrical current that is delivered from the power source to the load through the switching circuitry. Such control can include limiting the amount of electrical current or power drawn from the power source below an indicated current or power. In an example, switching circuitry 115 includes a driver circuit (not shown), that is configured to receive a control signal and, responsive to a value or other electrical property of the control signal, drive one or more switching elements in the switching circuitry 115, such as the one or more semiconductor gates or transistors, to turn on or off to control the amount of electrical current conducted through the switching circuitry. In an example, switching circuitry 115 includes one or more power FETs and one or more gate drivers arranged to controllably actuate the power FETs.

Sense device 120 includes a device that is configured to detect the amount of electrical power that is conducted by switching circuitry 115. In an example, sense device 120 includes a shunt resistor, or other circuitry, that is coupled in series with switching circuitry 115 and is configured to generate a voltage that is indicative of the amount of electrical current that flows through the sense device or the switching circuitry.

Monitor circuitry 125 includes circuitry that is configured to monitor or control the operation of BMS 100. In an example, monitor circuitry 125 is configured with hardware circuitry or software applications to measure and store data that is indicative of the electrical operation characteristics on one or more components of the BMS. In an example, monitory circuitry 125 measures or calculates the voltage or charge remaining on battery module 105, the current drawn by the load 110, or the temperature of the switching circuitry 115. In an example, monitor circuitry 125 is configured to control the operation of switching circuitry 115 based on a signal, such as sensed voltage generated by sense device 120. In an example, monitor circuitry 125 is configured to turn off switching circuitry 115 based on instantaneous or historic current conducted by the switching circuitry 115. In another example, monitor circuitry 125 is configured to turn off switching circuitry 115 based on instantaneous or historic heating in the switching circuitry 115. Monitor circuitry 125 can include conversion circuitry 130, accumulator circuitry 135, and logic circuitry 140. In some examples, monitor circuitry 125 includes a current reference 145 or voltage reference 150. In other examples, current reference 145 or voltage reference 150 is obtained from external circuitry.

Conversion circuitry 130 includes circuitry that is configured to convert a signal that is indicative of an electrical current conducted by switching circuitry 115 to a signal that is indicative of, or that is proportional to, the amount of electrical power consumed or dissipated by the switching circuitry. In an example, conversion circuitry 130 converts an analog signal obtained from sense device 120, such as a voltage developed across a shunt resistor, to a digital signal, such as a series of electrical pulses, that is indicative of average electrical power or cumulative energy consumed or dissipated by the switching circuitry 115. In an example, the frequency of the electrical pulses generated by conversion circuitry 130 is indicative of the consumed or dissipated electrical power. In an example, the frequency of the electrical pulses generated by conversion circuitry 130 (e.g., the number of electrical pulses generated within an indicated span of time or time period), increases responsive to an increase in the amount of consumed or dissipated electrical power. In another example, the frequency of the electrical pulses generated by conversion circuitry 130 decrease responsive to a decrease in the amount of consumed or dissipated electrical power.

Accumulator circuitry 135 includes circuitry that is configured to accumulate, count, or store data that is indicative of the series of electrical pulses generated by conversion circuitry 130. In an example, accumulator circuitry 135 includes a counter, such as a binary counter circuit, that is configured to increment or decrement a stored counter value responsive to each electrical pulse generated by conversion circuitry 130. In an example, the counter is a Gray code counter that is configured to increment or decrement a counter value such that only one bit in a binary representation of the counter is changed with each increment or decrement.

Logic circuitry 140 includes analog or digital logic circuitry that is configured to provide a control signal SWITCH_CTRL to control the operation of switching circuitry 115 based on the count of electricals pulses obtained by accumulator circuitry 135. In an example, logic circuitry 140 checks for the changes in these counts at indicated time intervals, such as at every positive edge of a timing signal used to drive or actuate the logic circuitry. Logic circuitry 140 includes a memory, or other hardware or software elements, that is configured to implement an indicated technique or algorithm for selectively actuating switching circuitry 115 based on the count of electricals pulses obtained by accumulator circuitry 135. In an example, logic circuitry 140 implements a technique for generating a control signal, such as SWITCH_CTRL, based on the count of electrical pulses generated by conversion circuitry 130 within an indicated time span, such as within an indicated number of cycles of a timing signal CLK. Logic circuitry 140, for example, actuates SWITCH_CTRL, responsive to determining that the number of electrical pulses generated by conversion circuitry 130 within a specified number of cycles of timing signal CLK meets or exceeds a threshold number of electrical pulses, such as described in U.S. patent application Ser. No. 17/219,025, which was filed on Mar. 31, 2021 and titled "Fast Overcurrent Detection In Battery Management System", the content of which is included herein by reference. In an example, the threshold number of electrical pulses, or the indicated time span, is selected based on physical electrical or thermal characteristics of one or more components of BMS 100. Such characteristics can include an electro-thermal model of switching device with or without any heat sinks, results from a simulation based on the electrical and thermal models, or a datasheet parameter, such as voltage or current tolerance, or characteristics of switching circuitry 115. Logic circuitry 140, in various examples, allows for configuring a threshold for multiple time spans to distinguish between one or more situations for controlling or interrupting power drawn in the BMS 100. In an example a first threshold can be used to in a fast-short circuit situation, such as where a very fast response (e.g., a real-time response or a response within 1 microseconds) is desired to mitigate damage. In another example, a second threshold can be used to in slower overcurrent situation, such as where the damage to the components can result if corrective action is not taken within an indicated time window, such as 1 microsecond to 100 milliseconds.

In operation, BMS 100 is configured to provide, such as through control of switching circuitry 115, current from battery module 105 to load 110. Over time, or under certain operating conditions, switching circuitry 115 can degrade or may be damaged, such as due to cumulative heating that exceeds the junction temperature or other operating tolerances of the circuitry. Such heating, and the associated damage, can be caused by increased or abnormal current drawn by the load 110, a malfunction in the battery module 105, a current spike, or another condition that can cause the switching circuitry 115 to conduct more current, or to consume more power, than is prescribed by the indicated tolerances of circuitry. The degraded or damaged switching circuitry can eventually fail, such as by permanently remaining in an on or fully conductive state. Such failure can result in damage to other components of BMS 100 or failure of the entire system, such as during a short circuit or an overcurrent event. In an example, failure of switching circuitry 115 can result in excessive current being drawn from battery module 105, causing damage to, or destroying, the module 105. BMS 100 mitigates these problems by monitoring the current flowing into switching circuitry 115 and switching the circuitry off in response to detecting an event or condition that may damage the switching circuitry. In an example, BMS 100 monitors, such as through operation of monitor circuitry 125, the current conducted by switching circuitry 115, such as by a voltage developed across a shunt resistor (e.g., sense device 120). BMS 100 then determines, based on the detected current, the physical characteristics (e.g., power or heat dissipation characteristics) of switching circuitry 115, and historic heating in the circuitry, whether to turn off the switching circuitry. In some examples, these techniques can protect the switching circuitry 115 from damage by turning off the switching circuitry within a short time of the occurrence of an event that may damage such circuitry. In an example, logic circuitry 140 can compute the estimated junction temperature of switching circuitry 115 (e.g., the junction temperature of a switching device) using the historic data generated by sense device 120, conversion circuitry 130, or accumulation circuitry 135. In an example, this turn off action is triggered responsive to the junction temperature, or the estimated junction temperature, of the switching device approaching a threshold junction temperature, such as the maximum allowed junction temperature of the switching circuitry.

Figure 2:
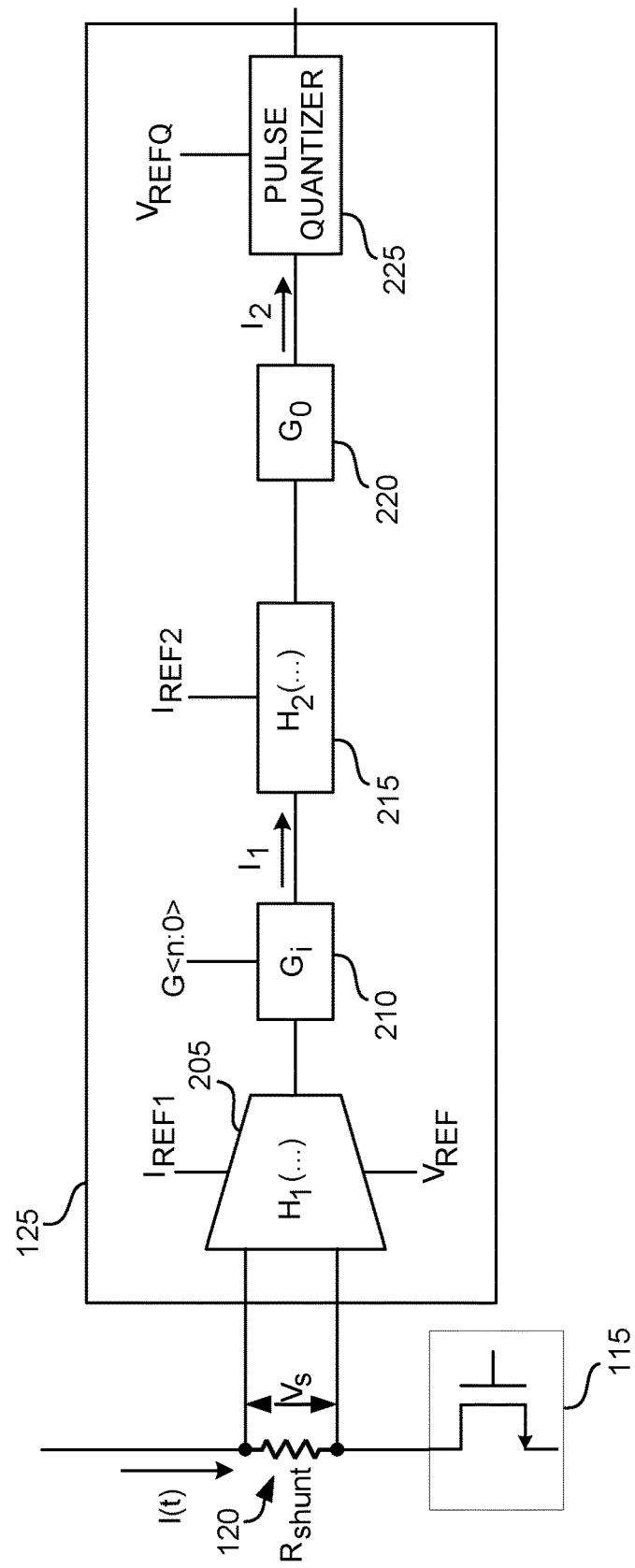
FIG. 2 illustrates an example of conversion circuitry for converting a current flowing through switching circuitry to a signal that is indicative of power dissipated as heat in the switching device.

FIG. 2 illustrates an example of conversion circuitry 200 for converting a current flowing through switching circuitry, such as switching circuitry 115, to a signal that is indicative of power dissipated in the switching circuitry. Conversion circuitry 200 is an example, or an element, of conversion circuitry 130. In an example, conversion circuitry 130 is an integrated circuit element of an analog front end circuit of a BMS 100.

Conversion circuitry 200 receives or obtains a reference voltage $V_{REF}$, a bias current $I_{REF1}$, and a sensed voltage $V_s$. In an example, reference voltage $V_{REF}$ is generated within the conversion circuitry 200, such as by circuitry on an integrated circuit die on which the conversion circuitry 200 is implemented. In another example, $V_{REF}$ is generated by circuitry external to the conversion circuitry 200. Bias current $I_{REF}$ is generated within the conversion circuitry 200 and has a nominal or indicated value and an associated permissible variation of tolerance. Sensed voltage $V_s$ is a voltage signal obtained from a sense device, such as a shunt resistor or sense device 120, that is configured to generate a voltage response to a current I(t). In an example, $V_s$ is a voltage developed across shunt resistor or sense device 120 responsive to the current I(t).

In an example, conversion circuitry 130 generates an output signal, such as a pulse train or a series of electrical pulses, having frequency $f_p$ that is proportional to heating or power in switching circuitry that conducts current I(t) (e.g., one or more switches or switching devices of switching circuitry 115). An example of the proportional relationship between frequency $f_p$ and heating or power in the switching circuitry is shown in expressions (1) and (2). The summation in expressions (1) and (20) is over the switching devices or elements of switching circuitry 115, such as elements $E_1$ through $E_n$, as shown in FIG. 1.

$$f_p \propto \sum_i G_i \left(\frac{V_s}{V_{ref}}\right)^{n_i} \quad (1)$$

-continued
$$f_p = K \cdot \sum_i G_i \left(\frac{V_s}{V_{ref}}\right)^{n_i} \quad (2)$$

In expressions (1) and (2), each exponential term $$\left(\frac{V_s}{V_{ref}}\right)^{n_i}$$

represents a current-to-power relationship for an element i, such as a FET switch, in the switching circuitry 115 that generates heat in response to the current I(t). In an example, switching circuitry 115 includes a set of one or more of such elements i, each of which can exhibit a linear or non-linear current-to-power relationship. In an example, the linearity of the relationship is indicated by exponent $n_i$. In certain examples, the value of $n_i$ associated with each indicated element of the switching circuitry 115 has a value between 1 and 2, where a value closer 1 is indicative of a linear current-to-power relationship and a value closer to 2 is indicative of a more non-linear current-to-power relationship. The term $G_i$ represents an integral gain associated with exponent $n_i$, or each indicated element of switching circuitry 115, and K represents a constant of proportionality.

Expressions (1) and (2) are obtained based on the realization that a current flowing through sense device 120 can cause each element of switching circuitry 115 to dissipate heat or to consume power based the resistance or impedance that each element exhibits or presents to the current. In an example, if an element i exhibits a constant resistance $R_{oni}$, there is a square relationship between a current $I_s(t)$ flowing through the element and power $P(t)_i$ or heating within the element, such as is shown in expression (3). The current $I_s(t)$ is a component of the current I(t) flowing through element i. In some examples, such as when elements i of switching circuitry 115 are connected in series, I(t) and $I_s(t)$ are the same currents.

$$P(t)_i = I_s^2(t) \cdot R_{oni} \quad (3)$$

In another example, an element i can exhibit a dynamic resistance $R_{ondyn}$ that is inversely proportional to a current $I_s(t)$ flowing through the element, such that $R_{ondyn}$ is given by expression (4). In this example, power within the element i is given by expression (5). An example of such a device is a device, such as a diode, that produces a constant voltage drop, or voltage drop that is substantially independent of the current flowing through the device. The power dissipated in such a device is proportional to the current flowing through the device since power is a product of voltage drop across the device and the current flowing through the device. A dynamic resistance can be associated with such a device, such that the value of this dynamic resistance is expressed by expression (4). In an example, in a diode or a diode-based switching device, the voltage drop across a p-n junction of the diode remains substantially constant with large changes in current and therefore the relationship between current and power in the diode is different from such relationships in a power FET or a Resistor. While power in a FET operating in the ON state can be expressed using the relationship shown in expression (3), power in a diode may be expressed, or closely approximated, using the relationship shown in expressions (4) and (5).

$$R_{ondyn} = \frac{R_{on}}{I_s} \quad (4)$$

$$P(t)_i = I_s^2(t) \cdot R_{ondyn} = I_s(t) \cdot R_{on_i} \quad (5)$$

In some examples, expression (5) can be generalized using the recognition that the dynamic resistance $R_{ondyn}$ of an element i of switching circuitry 115 can be approximated more closely as a non-integral exponent of the current $I_s(t)$ flowing through the element. Accordingly, a generalized expression for the power dissipated in one of the constituent elements i of switching circuitry 115 can be written as shown in expression (6). In this expression, the dependence of dynamic resistance $R_{ondyn}$ on the current $I_s(t)$ is accounted for in the exponent $n_i$ of the current, whereas $R_{oni}$ is a constant.

$$P(t)_i = I_s^{n_i}(t) \cdot R_{on_i} \quad (6)$$

The total power $P(t)_{total}$ in the switching circuitry 115 is obtained by summing the power $P(t)_i$ contributed by each element as shown in expression (7).

$$P(t)_{total} = \Sigma_i P(t)_i = \Sigma_i R_{on_i} I_s^{n_i} \quad (7)$$

In an example where the sense device 120 is a shunt resistor $R_{shunt}$, the voltage Vs obtained from sense device 120 is proportional to $I_s(t)$ and expression (7) can be written as shown in expression (8).

$$P(t)_{total} = \sum_k R_{on_i} \left(\frac{V_s}{R_{shunt}}\right)^{n_i} \quad (8)$$

$$P(t)_{total} = \sum_k \left(\frac{R_{on_i} V_{ref}^{n_i}}{R_{shunt}^{n_i}}\right) \cdot \left(\frac{V_s}{V_{ref}}\right)^{n_i} \quad (8.1)$$

$$P(t)_{total} = \sum_k C_i \cdot \left(\frac{V_s}{V_{ref}}\right)^{n_i} \quad (8.2)$$

The constants $C_i$ are scaling weights associated with element i of the switching circuitry and are independent of the voltage $V_s$ and therefore input current $I_s$. Each scaling weight Ci can be converted to a positive integer using one or more normalization techniques, such as interpreted multiplication of relation 8.2 by an indicated or predetermined number or constant. Such techniques can be used to associate an integer scaling constant $G_i$, instead of a fractional quantity $C_i$, with the current-to-power relationship for each constituent element of switching circuitry 115. The associated expression can then be converted to a normalized integer scale to obtain a corresponding expression (9) for total normalized power $P_N(t)$ in the switching circuitry.

$$P_N(t) = \sum_k G_i \left(\frac{V_s}{V_{ref}}\right)^{n_i} \quad (9)$$

A constant of proportionality K can then be incorporated into expression (9) to obtain a pulse train frequency that is proportional to total normalized power in switching circuitry 115, as shown in expression (10).

$$f_p = K \cdot \sum_k G_i \left(\frac{V_s}{V_{ref}}\right)^{n_i} \quad (10)$$

In example, expression 9 can be realized as a sum of currents. Such currents can be provided to a current controlled oscillator to realize equation 10. In an example, to realize equation 9 as a sum of currents and equation 10 as a current controlled oscillator, the conversion circuitry 200 includes transconductor circuitry 205, current converter circuitry 215, and pulse quantizer circuitry 225. Conversion circuitry 200 can also include gain circuitry 210 and 220. The components of conversion circuitry 200 are arranged to generate a series of electrical pulses having a frequency $f_p$ according to expression (10) and the techniques described herein. In an example, gain circuitry 210 and 220 provide the scaling or normalization gains $G_i$. In some examples, the gains $G_i$ are programmable integral gains selected based on system or application requirements or parameters of specific devices.

Transconductor circuitry 205 includes circuitry that is configured to convert a received voltage to a current based on the transconductance $g_m$ of the circuitry. In an example, transconductor circuitry 205 receives as input signals sensed voltage $V_s$, reference voltage $V_{REF}$, and bias current $I_{REF1}$. The transconductance gm is determined based on the input reference voltage $V_{REF}$, and bias current $I_{REF1}$ according to expression (11). Transconductor circuitry 205 then generates the current $I_{1i}$ based on $g_m$ as shown in expression (12). In an example, $I_1$ is scaled by the $G_i$ by transconductor circuitry 205 or gain circuitry 210 to produce an array of scaled or weighted currents $I_{1i-n}$, wherein each scaled current is $I_{1i}$ is associated with an element i of switching circuitry 115.

$$H_1 = g_m = \frac{I_{REF1}}{V_{REF}} \quad (11)$$

$$I_{1i} = V_s \cdot \frac{I_{REF1}}{V_{REF}} \cdot G_i = I(t) \cdot R_{shunt} \cdot \frac{I_{REF1}}{V_{REF}} \cdot G_i \quad (12)$$

Current converter circuitry 215 includes circuitry that is configured to implement an exponent law current converter that converts an input current, such as $I_1$, to an output current $I_{out}$ or $I_{2i}$ having a magnitude that is proportional to a specified exponent $n_i$. In an example, the current converter circuitry 215 has a transfer function given in expression (13) and produces, in combination with gain circuitry 220, output currents $I_{2i}$.

$$H_2 = \left(\frac{I_{1i}}{I_{REF1}}\right)^{n_i} \cdot \left(\frac{I_{REF1}}{D}\right) \quad (13)$$

$$I_{2i} = I^{n_i}(t) \cdot R_s^{n_i} \cdot \frac{I_{REF1}}{V_{REF}^{n_i}} \cdot \frac{G_i^{n_i} G_o}{D} \quad (14)$$

where bias current $I_{REF2}$ to circuitry 215 is D times $I_{REF1}$, D is a user of application specific natural number.

Pulse quantizer circuitry 225 include circuitry that is configured to generate a series of electrical pulses having a frequency that is proportional to the input current $I_2$, or the total electrical power generated in switching circuitry 115. In an example, $I_2$ is a sum of currents $I_{2i}$, shown in expression (14). In an example, pulse quantizer circuitry 225 includes a proportional-to-current oscillator circuitry that generates a signal having a frequency that is proportional to an input current. In another example, the pulse quantizer circuitry 225 includes compensation circuitry to generate an internal voltage reference $V_{REFQ}$ that compensates for variations in $I_{REF1}$, as described herein. In example, the series of electrical pulses generated by pulse quantizer circuitry 225 is provided to accumulator circuitry 135.

In an example, the oscillator circuitry is coupled to current converter circuitry 215 and to the compensation circuitry. The oscillator circuitry can include a capacitor to integrate the current $I_2$ to generate a sensed voltage. The oscillator circuitry can further include comparison circuitry to compare the sensed voltage to the reference voltage $V_{REFO}$ and generate an electrical pulse based on the comparison. In some examples, the oscillator circuitry quickly discharges the capacitor to reset the sensed voltage to 0 volts after generating each electrical pulse. The oscillator circuitry then restarts the operation of integrating the current $I_2$ over the capacitor to generate the sense voltage In an example, the oscillator circuitry discharges the capacitor at a rate that is substantially higher than the frequency of the timing signal CLK (FIG. 1), such that the time expended discharging the capacitor is small or negligible in comparison to the period of the timing signal. In an example, the time expended discharging the capacitor is less than 1 percent of the period of the timing signal.

Figures 3A, 3B:
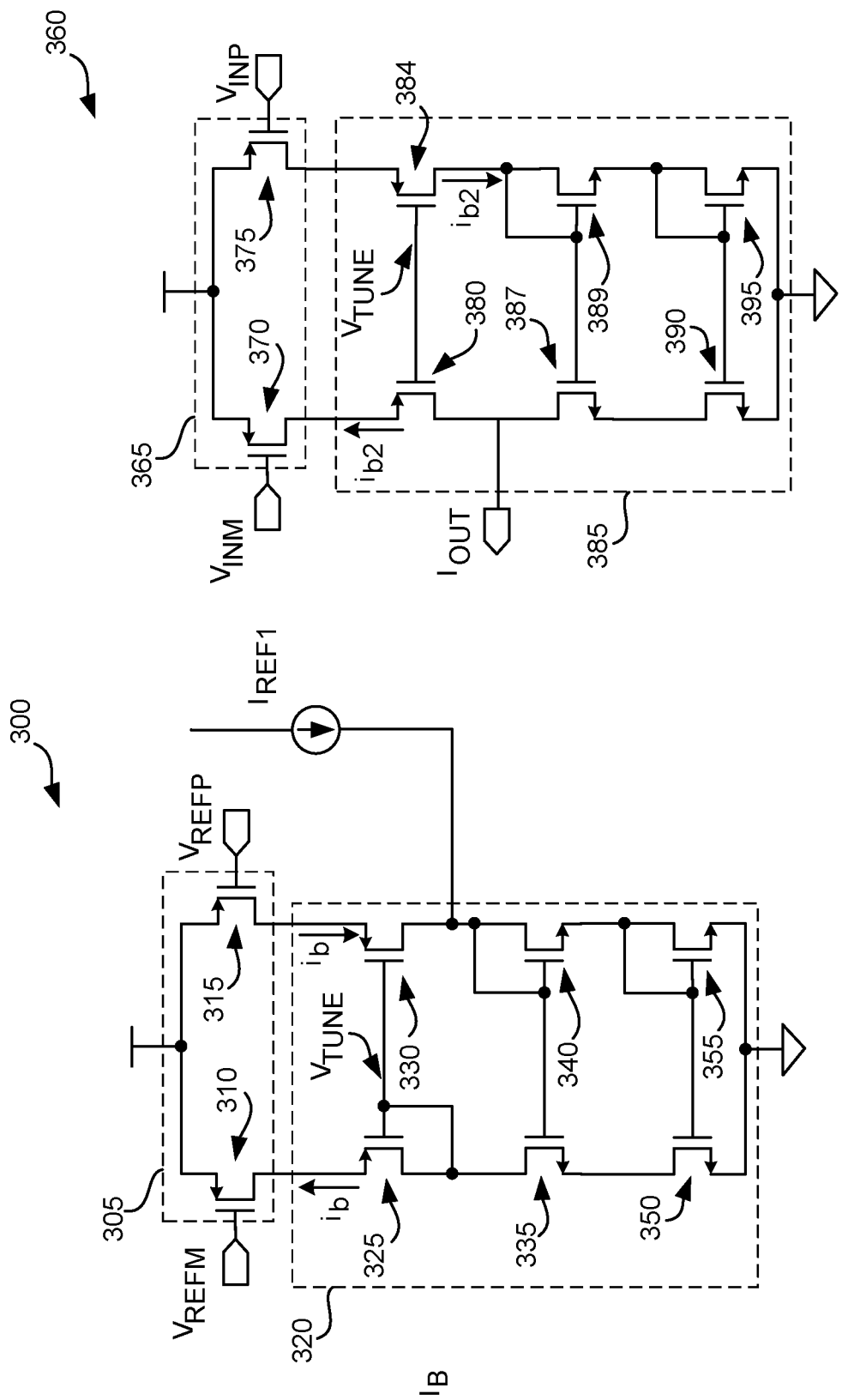
FIG. 3A illustrates an example of a circuit that is configured to obtain a transconductance based on a provided reference current and a provided reference voltage.
FIG. 3B illustrates an example of a circuit that is configured to convert a voltage to a current based on a provided transconductance.

FIGS. 3A and 3B collectively illustrate transconductor circuitry having a selectable or programmable transconductance. Such transconductor circuitry can be an example of transconductor circuitry 205. The circuitry illustrated in FIGS. 3A and 3B are operated in a primary-secondary or server-client architecture. The primary circuitry 300 includes self-biasing circuitry that generates an indicated transconductance gm based on a provided reference current and reference voltage. The value of the generated transconductance is determined by the ratio of reference current to reference voltage and is robust or tolerant to process, voltage and temperature variations. The secondary circuitry 360 is configured to copy or obtain transconductance $g_m$ from the primary circuitry 300 based on a turning voltage generated by the primary circuitry 300 generated in the process of generating the biasing current. The secondary circuit 360 is configured to use the copied transconductance to generate a current that is proportional to a received input voltage, such as $V_s$.

FIG. 3A illustrates an example of circuitry 300 (e.g., primary circuitry) that is configured to obtain a transconductance based on a provided reference current and a provided reference voltage. Circuitry 300 includes input circuitry 305 and biasing circuitry 320. In an example, input circuitry 305 includes a pair of input transistors 310 and 315 that are arranged to receive an input signal, such as a differential voltage $V_{REFM}$ and $V_{REFP}$. In an example, voltage $V_{REFM}$ and $V_{REFP}$ are constant voltages derived from the input reference voltage $V_{REF}$, such that $V_{REF}=(V_{REFP}-V_{REFM})$. In another example, biasing circuitry 320 includes cascaded current mirrors formed by transistors 335, 340, 350, and 355. Biasing circuitry 320 further includes coupling circuitry, or a coupling stage, having transistors 325 and 330. In certain examples, transistors 310, 315, 325, and 330 are PFETs, while transistors 335, 340, 350 and 355 are NFETs.

In operation, biasing circuitry 320 generates a voltage $V_{TUNE}$ such that the differential current arising out of the '$V_{REF}=V_{REFP}-V_{REFM}$' difference in the gate to source voltages of transistors 315 and 310 is $2i_b=I_{REF1}$. Transistors 310 and 315 are sized to operate in their linear region of operation, thereby enabling the drain to source voltage defined by $V_{TUNE}$ to control the value of the differential current ib. Coupling transistors 325 and 330 have a larger W/L ratio than corresponding W/L ratios of transistors 310 and 315. The drains of transistors 310 and 315 are connected as a source follower, therefore the source to drain voltages of transistors 310 and 315 are substantially identical (e.g., having values that differ only by an indicated or acceptable margin of error) due to the voltage drop across the source followers formed by transistors 325 and 330 responsive to $V_{TUNE}$ being substantially identical. Further the transistors 310 and 315 are made weaker than transistors 325 and 330 such that a large a $V_{DS}$ is needed across them to generate a differential current of $2i_b=I_{REF1}$. The large $V_{DS}$ across transistors 310 and 315 reduces the sensitivity of circuitry 300 to mismatches (e.g., such as by process, temperature, or voltage variations) in the source followers formed by transistors 325 and 330. In an example, for $V_{REF}=125$ mV and $I_{REF1}=1$ uA, $V_{DS}$ is approximately 1V. Circuitry 300 receives constant current $I_{REF1}$ and a constant reference voltage (e.g., $V_{REFP}-V_{REFM}$) as indicated in FIG. 3A. The cascaded current mirror formed by transistors 335, 340, 350, and 355 converts $I_{REF1}$ the into a voltage at the drain of transistor 335 as these transistors together form a current mirror amplifier with an output node at the drain of 335. The connection between the drain of transistor 335 and the gate of transistors 325 and 330 provides negative feedback that stabilize the circuitry 300 by generating the voltage $V_{TUNE}$ such that the excess current $I_{REF1}$ intentionally provided in the right hand side of circuitry 300 is compensated by the differential current $2i_b$ generated by transistors 310 and 315 by virtue of their transconductance. Due to the large gain provided by the current mirror amplifier formed by transistors 335, 350, 340 and 355, the negative feedback causes the differential current $2i_b$ to compensate for the excess current $I_{REF1}$. Since the condition $2i_b=g_m \cdot V_{REF}=I_{REF}$ is forced by the negative feedback, the modulation of the voltage $V_{TUNE}$ leads to a transconductance $g_m=I_{REF1}/V_{REF}$.

Voltage $V_{TUNE}$ defines the drain-to-source voltage $V_{DS}$ for input transistors 310 and 315 through the cascaded source follower transistors 325 and 330. Additionally, since changes in transconductance, and therefore $i_b$, can be caused by process, voltage, and temperature (PVT) variations, the operation of the biasing circuitry 320 enables the input transistors 310 and 315 to robustly generate a transconductance $g_m$ based on the provided reference voltage and reference current across PVT variations by actively regulating voltage $V_{TUNE}$ using the negative feedback. In an example, circuitry 300 does not require startup circuitry because $I_{REF1}$ is always present and transistors 340 and 355 are always conducting current due to their diode connection.

FIG. 3B illustrates an example of circuitry 360 (e.g., secondary circuitry) that is configured to convert a voltage to a current based on a provided transconductance. In an example, circuitry 360 is substantially identical to circuitry 300, with an exception that the gate of transistor 380 is not configured to receive any negative feedback, such as the negative feedback received at the gate of transistor 325. Circuitry 360 operates as an open loop circuit with transconductance defined by voltage $V_{TUNE}$ copied from circuitry 300. Circuitry 360 includes input circuitry 365 and biasing circuitry 385. In an example, input circuitry 365 includes a pair of input transistors 370 and 375 that are arranged to receive an input signal, such as voltage $V_s$ generated by sense device 120. In another example, biasing circuitry 320 includes cascaded current mirrors formed by transistors 387, 389, 390, and 395. Biasing circuitry 385 further includes coupling circuitry, or a coupling stage, having transistors 380 and 384. In certain examples, transistors 370, 375, 380, and 384 are PFETs, while transistors 387, 389, 390, and 395 are NFETs.

In operation, circuitry 365 couples $V_{TUNE}$ to the gates of transistors 380 and 384. This causes input transistors 370 and 375 to have the same $V_{DS}$ at input transistors 310 and 315, thereby determining the value of current $I_{B2}$ and forcing transistors 370 and 375 to have the same transconductance ($I_{REF}/(V_{REFP}-V_{REFM})$) as transistors 310 and 315. In linear mode of operation, the current $i_{b2}$ generated by biasing circuitry 385 is proportional to the input voltage $V_s$, and therefore the differential current produced by circuitry 360 has the transconductance of ($I_{REF1}/(V_{REFP}-V_{REFM})$) at other input voltages $V_s$ ($V_{INP}-V_{INM}$). Input circuitry 365 produces, responsive to the input voltage $V_s$, an output current $I_{out}$ that is proportional to the current $I_{1i}$, as shown in expression (12). Current $I_{out}$ can be magnified using a conventional current multiplier circuits to realize the parameter $G_i$ included in expression (12).

Figure 4:
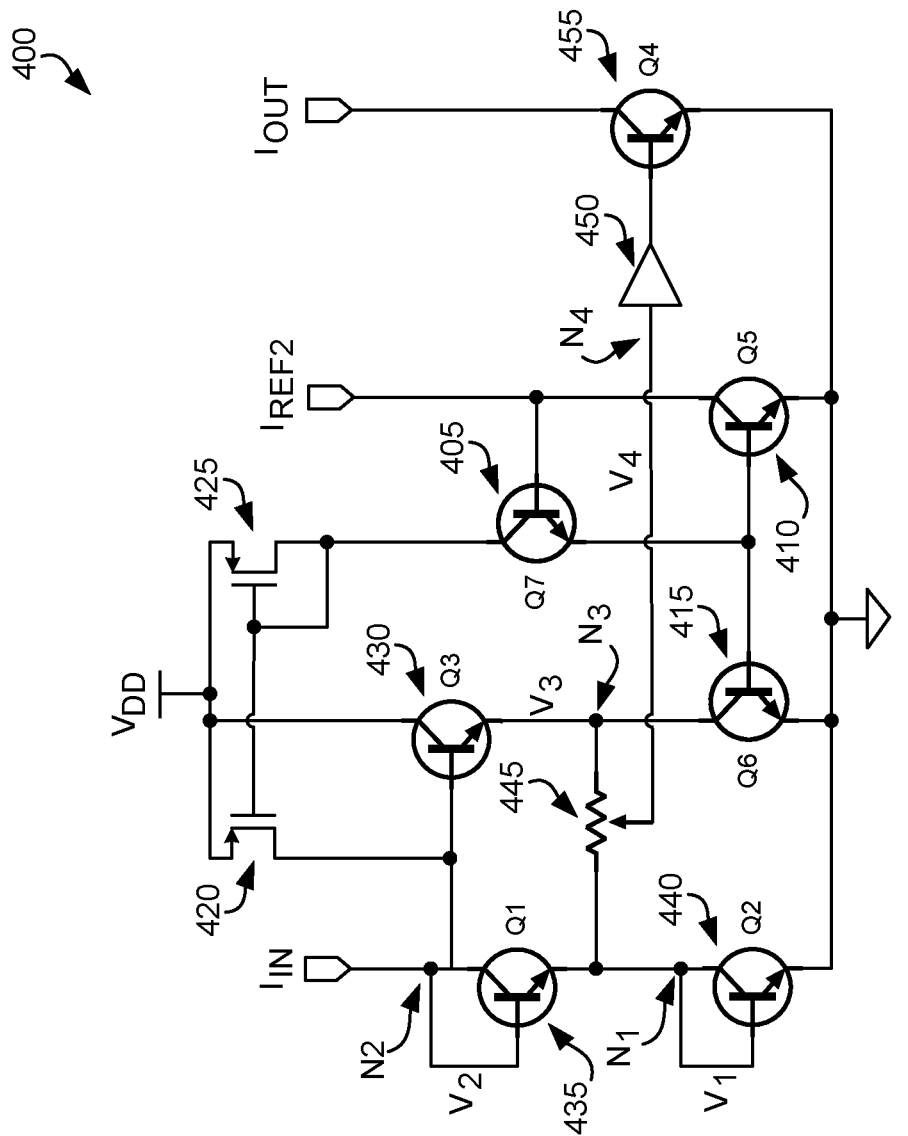
FIG. 4 illustrates an example of a circuit that is configured to generate an output current proportional to a selectable exponent of an input current.

FIG. 4 illustrates an example of circuitry 400 that is configured to generate an output current proportional to a selectable exponent of an input current $I_{IN}$. FIG. 4 is an example of converter circuitry 215 or an exponent law current converter circuit having a transfer function shown in expression (13). The output current $I_{OUT}$ generated by circuitry 400 is shown in expression (15).

$$I_{out} = \left(\frac{I_{in}}{I_{REF2}}\right)^n \cdot I_{REF2} \qquad (15)$$

The term n is selectable through the resistor divider circuitry 445 between a value of 1 to 2. Expression (15) can obtained from the bipolar junction transistor (BJT) current equations shown in expression (16), or equivalently, expression (16.1).

$$I = I_s \cdot \exp\left(\frac{V_{be}}{V_t}\right) \qquad (16)$$

$$V_{be} = \ln(I/I_s) \cdot V_t \qquad (16.1)$$

In expression (16), I is the collector current, $I_s$ is the reverse saturation current, $V_{be}$ is the base to emitter voltage, and $V_t$ is the thermal voltage. In an example where all BJTs in circuitry 400 have the same size and are matched in layout, voltages $V_1$, $V_2$, and $V_3$ can be obtained according to expressions (16.2), (16.3), and (16.4). Expressions (16.2), (16.3), and (16.4) are based on the approximation that these BJTs have a high emitter to base current ratio and most or at least a majority of the base current of each of transistors 410, 415, and 430, is compensated for by circuitry formed by transistors 405, 425 and 420.

$$V_1 = \ln\left(\frac{I_{IN}}{I_s}\right) \cdot V_t \qquad (16.2)$$

$$V_2 = 2 \cdot \ln\left(\frac{I_{IN}}{I_s}\right) \cdot V_t \qquad (16.3)$$

$$V_3 = 2 \cdot \ln\left(\frac{I_{IN}}{I_s}\right) \cdot V_t - \ln\left(\frac{I_{REF2}}{I_s}\right) \cdot V_t = V_t \cdot \ln\left(\frac{I_{IN}^2}{I_s \cdot I_{REF2}}\right) \qquad (16.4)$$

Expressions (16.2) and (16.3) are direct application of general expression (16.1) over transistors 440 and 435 for a current $I_{IN}$ passing through these transistors. Expression (16.4) indicates that voltage $V_3$ is obtained by subtracting base-to-emitter voltage of transistor 430 from voltage $V_2$. The base to emitter voltage of transistor 430 is given by the second term in expression (16.4) by direct application of expression (16.1) to transistor 430. Current $I_{REF2}$ is driven through transistor 430 by the current mirror formed by transistors 410 and 415. Transistor 405, in this configuration, provide the base current for transistors 415 and 410. The current flowing through transistor 405 is mirrored by transistors 425 and 420 to provide base current compensation to transistor 430. In an example where the input of voltage buffer 450 is connected or coupled to voltage $V_3$, such as at node $N_3$, then the current $I_{OUT}$ produced in, or conducted by, transistor 455 is given, by application of expression (16) and (16.4), as $$I_{out} = I_s \cdot \exp\left(\frac{V_3}{V_t}\right) = \left(\frac{I_{IN}}{I_{REF2}}\right)^2 \cdot I_{REF2}. \qquad (16.5)$$

Similarly, if the voltage buffer 450 has its input connected to voltage $V_1$, such as at node $N_1$, the current $I_{OUT}$ produced in, or conducted by, transistor 455 is given, by application of expressions (16) and (16.2), as $$I_{out} = I_s \cdot \exp\left(\frac{V_1}{V_t}\right) = \left(\frac{I_{IN}}{I_{REF2}}\right) \cdot I_{REF2}. \qquad (16.7)$$

In some examples, the input of voltage buffer 450 is connected, such as through resistor divider 445, to a voltage $V_4$ between voltages $V_1$ and $V_3$, such as at node $N_4$. In an example, the resistor divider 450 has a large resistance value and therefore do not load nodes $N_1$ and $N_3$. The voltage $V_4$ at the input of voltage buffer 450 can be expressed in relation to voltages $V_1$ and $V_3$ as $$V_4 = V_1 + n'(V_3 - V_1), \text{ where } 0 < n' < 1 \qquad (16.8).$$

The value of $I_{OUT}$ can be obtained as expressed in expression by (16.9) by substituting expression (16.8) for the value of voltage $V_4$ and expressions 16.2 and (16.4) for respective values of voltages $V_1$ and $V_3$.

$$I_{out} = I_s \cdot \exp\left(\frac{V_4}{V_t}\right) = I_s \cdot \exp\left((1-n') \cdot \ln\left(\frac{I_{IN}}{I_s}\right) + n' \cdot \ln\left(\frac{I_{IN}^2}{I_s I_{REF2}}\right)\right) \qquad (16.9)$$

Expression (16.9) can further simplified to express the value of IOUT shown in expression (16.10).

$$I_{out} = I_s \cdot \exp\left(\ln\left(\frac{I_{IN}^{(1+n')}}{I_s \cdot I_{REF2}^{n'}}\right)\right) = \left(\frac{I_{IN}}{I_{REF2}}\right)^{1+n'} \cdot I_{REF2} \qquad (16.10)$$

Expression (16.10) is equivalent to expression (15) through the substitution n=1+n', where n' is a fraction less than unity, and n has a value between 1 and 2.

In an example, circuitry 400 includes FETs 420 and 425, BJTs 405, 410, 415, 430, 435, 440, and 455. Circuitry 400 further includes buffer circuitry 450 and turning resistor divider circuitry 445.

In operation, transistors 435 and 440 are diode connected and conduct input current $I_{IN}$. Transistors 415 and 430 conduct reference current $I_{REF2}$ which is mirrored from transistor 410. Transistor 405 supplies a base current to transistors 410 and 415. This base current is mirrored by transistors 420 and 425, to enable transistor 420 to provide a base current to transistor 430. The resistor divider 445 is adjustable to select the exponent n or $n_i$ between 1 and 2, such that when voltage $V_4$ at node N2 equals voltage $V_1$, n is equal to 1, and when voltage $V_4$ equals voltage $V_3$ at node N1, n=2. In some examples, two or more taps or electrical connections are connected to resistor divider circuitry 445 to obtain two or more output currents with different exponents of input current in a range of 1 to 2.

Figure 5:
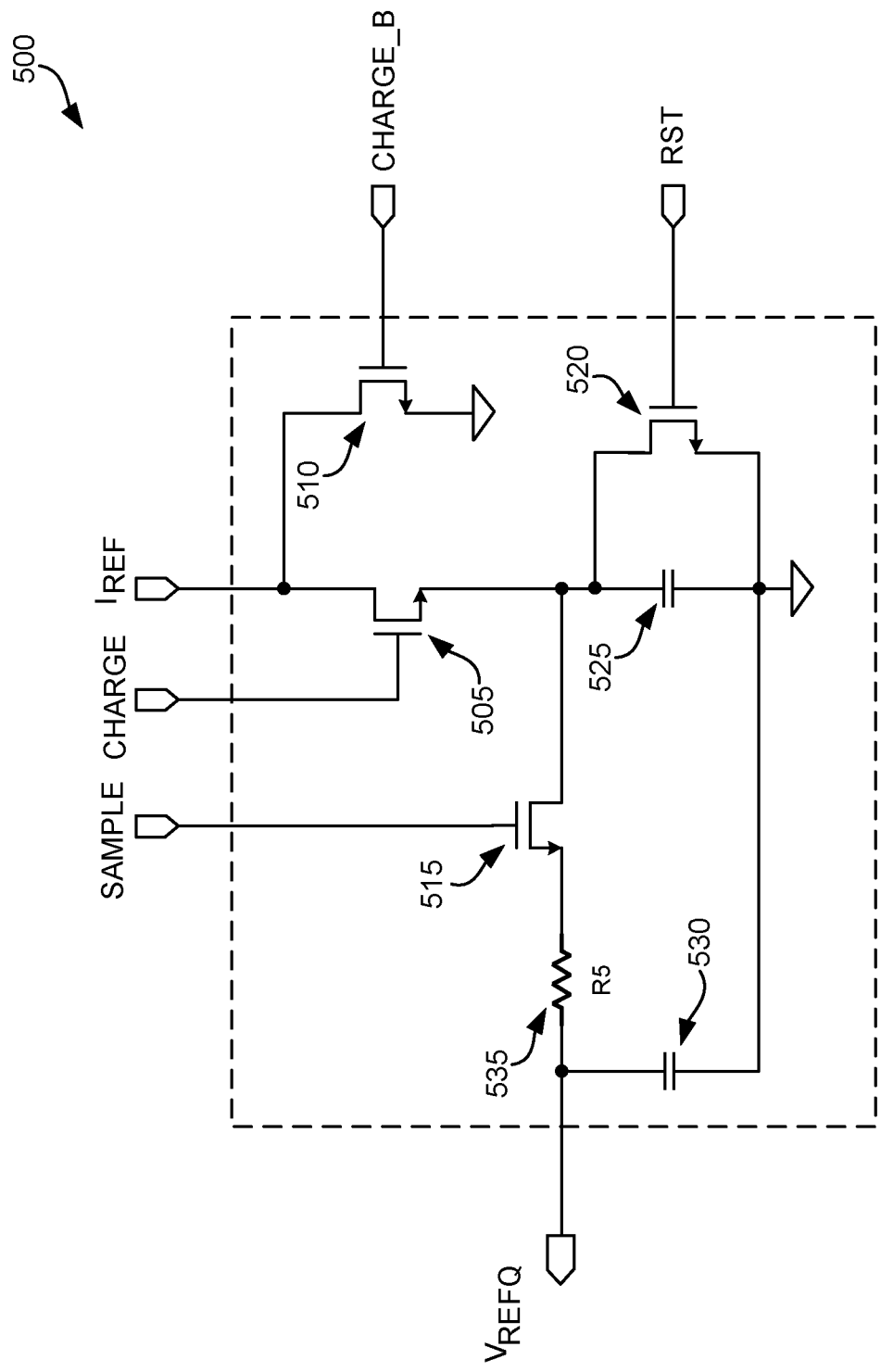
FIG. 5 illustrates an example of a circuit that is configured to generate an error compensating reference voltage.

FIG. 5 illustrates an example of circuitry 500 (e.g., a reference circuit) that is configured to generate a reference voltage $V_{REFQ}$. In an example the reference voltage $V_{REFQ}$ is used by pulse quantizer circuitry 225, such as by an oscillator in the quantizer circuitry for converting the current $I_2$ to a series of pulses based on comparison to the reference voltage. Aspects of circuitry 500 are based on the following realizations.

In a conventional oscillator, an input current, such as current $I_2$ provided by expression (14), is stored on a capacitor until voltage of the capacitor rises to a fixed or constant reference voltage. The voltage on the capacitor is compared to the reference voltage to generate a signal having a frequency that is proportional to the input current. As shown in expression (14), the input current is proportional to, or depends on, the reference current $I_{REF1}$, and may therefore have an accuracy that is susceptible to, or affected by, variations in the reference current. This dependency can be removed or mitigated by causing the reference voltage used by the oscillator to be proportional to, or to depend on, reference current $I_{REF1}$.

Additionally, an oscillator's frequency can be inversely proportional to the capacitance value of the capacitor used to store or integrate the input current, such that the frequency of the oscillator can vary with process variations in the capacitance value. This variation can be compensated for by ensuring that the oscillator's reference voltage is made to vary inversely with the capacitance value.

Furthermore, variations in the timing signal used by, for example, accumulator circuitry 135 or logic circuitry 140 to count the number of pulses generated by conversion circuitry 130 within an indicated time span, can cause variations in, or change, the number of pulses which are received in the indicated time span. This may be the case even when the current through the sense device 120 or switching circuitry 115 is kept constant. Such variations can be mitigated or compensated for by causing the oscillator's reference voltage to vary proportional to the timing or clock signal frequency.

The above realizations can be combined and used to obtain a reference voltage $V_{REFQ}$ according to expression (16).

$$V_{REFQ} = N \cdot t_p \cdot \frac{I_{REF1}}{C} \qquad (17)$$

In expression (17), N is a fixed number, and $t_p$ is the cycle of the timing signal, and C is the capacitance value of the oscillator capacitor. In an example N is an indicated number of timing signal cycles and may be selected based on a preferred responsiveness or sensitivity of the reference voltage to variations in timing signal frequency. The definition for oscillator's reference voltage $V_{REFQ}$ accomplishes the objective of mitigating the effects of input current $I_2$ dependency on $I_{REF1}$ variations, oscillator frequency dependency on capacitor value variation, and pulse count dependency on timing signal frequency variation. The reference voltage expressed in expression (17) is obtained by integrating the reference current $I_{REF}$ on a capacitor C for the time $N*t_p$, such as by circuitry 500.

In an example, circuitry 500 includes transistors 505, 510, 515, and 520. Circuitry 500 further includes capacitor 525, capacitor 530, and resistor 535.

In operation, capacitor 525 is charged by current $I_{REF1}$ for N cycles of a timing signal, such as timing signal CLK shown in FIG. 1. The charging is stopped by making signal CHARGE inactive and making signal CHARGE_B active. Capacitor 525 is sampled by providing a short pulse on signal SAMP to transfer charge from capacitor 525 to capacitor 530. Capacitor C is then discharged by activating or driving signal RST. The process is then repeated. After some initial startup time the voltage on capacitor 530 has the value given by expression (17).

VARIOUS EXAMPLES

Example 1 is a device to convert a detected voltage, that is indicative of current conducted by a switching circuit, to a series of electrical pulses that is indicative of electrical power dissipated by the switching circuit responsive to the current, the device comprising: a transconductor circuit including: a first circuit to receive a reference current and a first reference voltage, and to obtain a transconductance based on an auto-generated bias current and the reference current and the first reference voltage, a value of the transconductance is determined by the reference current and the first reference voltage; a second circuit coupled to the first circuit to receive the detected voltage, and to generate a first current based on the detected voltage and the obtained transconductance.

In Example 2, the subject matter of Example 1 includes, wherein the first circuit includes: a first differential input circuit to receive the first reference voltage; and a biasing circuit to receive the reference current and to generate the auto-generated bias current.

In Example 3, the subject matter of Example 2 includes, wherein the biasing circuit is to automatically adjust a the auto-generated bias current responsive to process, voltage, or temperature variations in the input circuit.

In Example 4, the subject matter of Examples 2-3 includes, wherein: the first differential input circuit comprises a differential field effect transistor (FET) circuit; and the biasing circuit comprises a FET current mirror.

In Example 5, the subject matter of Examples 2-4 includes, a coupling circuit to couple the auto-generated biasing current to the second circuit, the second circuit configured to generate the obtained transconductance using the coupled auto-generated biasing current.

In Example 6, the subject matter of Example 5 includes, wherein: the second circuit includes a second differential input circuit to receive the detected voltage; and a second biasing circuit having a biasing current determined by the coupled auto-generated biasing current.

In Example 7, the subject matter of Example 6 includes, wherein: the second differential input circuit comprises a differential field effect transistor (FET) circuit; and the second biasing circuit comprises a FET current mirror.

In Example 8, the subject matter of Examples 1-7 includes, a current-to-current converter circuit coupled to the transconductor circuit to receive the first current, and to generate a second current that is proportional to a configurable exponent of the first current.

In Example 9, the subject matter of Example 8 includes, an oscillator circuit coupled to the current-to-current converter circuit, the oscillator circuit comprising: a first capacitor to integrate the second current generated by the converter circuit to generate an integrated voltage; a comparison circuit to compare the integrated voltage to a second reference voltage; and an output circuit to provide the series of electrical pulses based on the comparison; and a reference circuit to generate the second reference voltage based on the reference current and a timing signal used to count electrical pulses in the series of electrical pulses, the reference circuit comprising: an integrator circuit having a second capacitor to integrate the reference current; and a control circuit to actuate the integrator circuit to generate the second reference voltage based on integration of the reference current for one or more cycles of the timing signal.

In Example 10, the subject matter of Examples 8-9 includes, wherein a value of the configurable exponent of the first current is indicative of a dynamic resistance of the switching circuit.

Example 11 is a system to convert a detected voltage, that is indicative of current conducted by a switching circuit, to a series of electrical pulses that is indicative of electrical power dissipated by the switching circuit responsive to the current conducted by a switching circuit, the system comprising: a current-to-current converter circuit coupled to the transconductor circuit to receive a first current that is indicative of the detected voltage, the current-to-current converter circuit comprising: a current squaring circuit to amplify the first current by an arithmetic power of the first current; and a scaling circuit to scale the amplified first current based on a reference current to generate a second current.

In Example 12, the subject matter of Example 11 includes, wherein the current to current converter circuit includes an adjustment circuit to selectably adjust the arithmetic power.

In Example 13, the subject matter of Example 12 includes, wherein the adjustment circuit is configured to selectably adjust the arithmetic power to a value between 1 and 2.

In Example 14, the subject matter of Examples 12-13 includes, wherein the adjustment circuit includes a resistor divider to selectably adjust the arithmetic power to the value between 1 and 2.

In Example 15, the subject matter of Examples 12-14 includes, wherein the system further comprises: a transconductor circuit including: a first circuit to receive the reference current and a first reference voltage, and to obtain a transconductance based on an auto-generated bias current and the reference current and the first reference voltage, a value of the transconductance is determined by the reference current and the first reference voltage; and a second circuit coupled to the first circuit to receive the detected voltage, and to generate the first current based on the detected voltage and the obtained transconductance.

In Example 16, the subject matter of Example 15 includes, an oscillator circuit coupled to the current-to-current converter circuit, the oscillator circuit comprising: a first capacitor to integrate the second current generated by the converter circuit to generate an integrated voltage; a comparison circuit to compare the integrated voltage to a second reference voltage; and an output circuit to provide the series of electrical pulses based on the comparison; and a reference circuit to generate the second reference voltage based on the reference current and a timing signal used to count electrical pulses in the series of electrical pulses, the reference circuit comprising: an integrator circuit having a second capacitor to integrate the reference current; and a control circuit to actuate the integrator circuit to generate the second reference voltage based on integration of the reference current for one or more cycles of the timing signal.

Example 17 is a method for generating a signal that is indicative of electrical power dissipated by a switching circuit, the method comprising: obtaining, from a sensing circuit, a sensed voltage that is indicative of current conducted by the switching circuit; converting, by a transconductor circuit, the sensed voltage to a first current, the transconductor circuit having a selectable transconductance determined by a provided reference voltage and a provided reference current; converting, using a power law converter circuit, the first current to a second current based on a dynamic resistance of the switching circuit; generating a series of one or more pulses that is indicative of electrical power dissipated by a switching circuit by: integrating the second current on a first capacitor; comparing a voltage across the first capacitor to a second reference voltage; generating an electrical pulse of the series of electrical pulses based on the comparison; and generating, by a compensation circuit, the second reference voltage based on the reference current and a timing signal, the reference having a value that automatically adjusts to compensate for variation in at least one of a capacitor value, the reference current, or a cycle time of the timing signal.

In Example 18, the subject matter of Example 17 includes, wherein the sensing circuit comprises a shunt resistor coupled in series with the electrical circuit.

In Example 19, the subject matter of Examples 17-18 includes, wherein generating the second reference voltage comprises: integrating the reference current on a second capacitor for one or more cycles of the timing signal, a cycle of the timing signal being indicative of a unite of time for determining electrical power dissipated by a switching circuit based on the one or more pulses.

In Example 20, the subject matter of Examples 17-19 includes, wherein the power law converter circuit converts the first current to a second current based on a dynamic resistance of the switching circuit by: amplifying the first current to generate an intermediate current having an amplitude that is a selectable arithmetic power of an amplitude of the first current; and scaling intermediate current proportional to the reference current to obtain the second current.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments in which the inventive subject matter can be practiced. These embodiments are also referred to generally as "examples." Such examples can include components in addition to those shown or described. However, the present inventors also contemplate examples in which only those components shown or described are provided. Moreover, the present inventors also contemplate examples using any combination or permutation of those components shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes components in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, the term "connected" means a direct electrical connection between the things that are connected, without any intermediary devices. The term "coupled" includes either a direct electrical connection between the things that are connected, or an indirect connection through one or more passive or active intermediary devices. The term "circuit" corresponds to one or more passive and/or active components that are arranged to cooperate with one another to provide a desired function. The term "signal" at least one current signal, Voltage signal or data signal, such as an analog signal, a digital signal, or a mixed analog and digital signal.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

The claimed invention is:

1. A device to convert a detected voltage, that is indicative of current conducted by a switching circuit, to a series of electrical pulses that is indicative of electrical power dissipated by the switching circuit responsive to the current, the device comprising:
   a transconductor circuit including:
      a first circuit to receive a reference current and a first reference voltage, and to obtain a transconductance based on an auto-generated bias current and the reference current and the first reference voltage, a value of the transconductance is determined by the reference current and the first reference voltage; and
      a second circuit coupled to the first circuit to receive the detected voltage, and to generate a first current based on the detected voltage and the obtained transconductance; and
   a pulse quantizer coupled with an output of the transconductor circuit and configured to generate the series of electrical pulse that is indicative of electrical power dissipated by the switching circuit responsive to the current conducted by a switching circuit.

2. The device of claim 1, wherein the first circuit includes:
   a first differential input circuit to receive the first reference voltage; and
   a biasing circuit to receive the reference current and to generate the auto-generated bias current.

3. The device of claim 2, wherein the biasing circuit is to automatically adjust a the auto-generated bias current responsive to process, voltage, or temperature variations in the input circuit.

4. The device of claim 2, wherein:
   the first differential input circuit comprises a differential field effect transistor (FET) circuit; and
   the biasing circuit comprises a FET current mirror.

5. The device of claim 2, including a coupling circuit to couple the auto-generated biasing current to the second circuit, the second circuit configured to generate the obtained transconductance using the coupled auto-generated biasing current.

6. The device of claim 5, wherein:
   the second circuit includes a second differential input circuit to receive the detected voltage; and
   a second biasing circuit having a biasing current determined by the coupled auto-generated biasing current.

7. The device of claim 6, wherein:
   the second differential input circuit comprises a differential field effect transistor (FET) circuit; and
   the second biasing circuit comprises a FET current mirror.

8. The device of claim 1, further comprising:
   a current-to-current converter circuit coupled to the transconductor circuit to receive the first current, and to generate a second current that is proportional to a configurable exponent of the first current.

9. The device of claim 8, further comprising:
   an oscillator circuit coupled to the current-to-current converter circuit, the oscillator circuit comprising:
   a first capacitor to integrate the second current generated by the converter circuit to generate an integrated voltage;
   a comparison circuit to compare the integrated voltage to a second reference voltage; and an output circuit to provide the series of electrical pulses based on the comparison; and
a reference circuit to generate the second reference voltage based on the reference current and a timing signal used to count electrical pulses in the series of electrical pulses, the reference circuit comprising:
an integrator circuit having a second capacitor to integrate the reference current; and
a control circuit to actuate the integrator circuit to generate the second reference voltage based on integration of the reference current for one or more cycles of the timing signal.

10. The device of claim 8, wherein a value of the configurable exponent of the first current is indicative of a dynamic resistance of the switching circuit.

11. A system to convert a detected voltage, that is indicative of current conducted by a switching circuit, to a series of electrical pulses that is indicative of electrical power dissipated by the switching circuit responsive to the current conducted by a switching circuit, the system comprising:
a current-to-current converter circuit coupled to a transconductor circuit to receive a first current that is indicative of the detected voltage, the current-to-current converter circuit comprising:
a current squaring circuit to amplify the first current by an arithmetic power of the first current; and
a scaling circuit to scale the amplified first current based on a reference current to generate a second current; and
a pulse quantizer coupled with an output of the transconductor circuit and configured to generate the series of electrical pulse that is indicative of electrical power dissipated by the switching circuit responsive to the current conducted by a switching circuit.

12. The system of claim 11, wherein the current to current converter circuit includes an adjustment circuit to selectably adjust the arithmetic power.

13. The system of claim 12, wherein the adjustment circuit is configured to selectably adjust the arithmetic power to a value between 1 and 2.

14. The system of claim 12, wherein the adjustment circuit includes a resistor divider to selectably adjust the arithmetic power to a value between 1 and 2.

15. The system of claim 12, wherein the system further comprises:
a transconductor circuit including:
a first circuit to receive the reference current and a first reference voltage, and to obtain a transconductance based on an auto-generated bias current and the reference current and the first reference voltage, a value of the transconductance is determined by the reference current and the first reference voltage; and
a second circuit coupled to the first circuit to receive the detected voltage, and to generate the first current based on the detected voltage and the obtained transconductance.

16. The system of claim 15, further comprising:
an oscillator circuit coupled to the current-to-current converter circuit, the oscillator circuit comprising:
a first capacitor to integrate the second current generated by the converter circuit to generate an integrated voltage;
a comparison circuit to compare the integrated voltage to a second reference voltage; and
an output circuit to provide the series of electrical pulses based on the comparison; and
a reference circuit to generate the second reference voltage based on the reference current and a timing signal used to count electrical pulses in the series of electrical pulses, the reference circuit comprising:
an integrator circuit having a second capacitor to integrate the reference current; and
a control circuit to actuate the integrator circuit to generate the second reference voltage based on integration of the reference current for one or more cycles of the timing signal.

17. A method for generating a signal that is indicative of electrical power dissipated by a switching circuit, the method comprising:
obtaining, from a sensing circuit, a sensed voltage that is indicative of current conducted by the switching circuit;
converting, by a transconductor circuit, the sensed voltage to a first current, the transconductor circuit having a selectable transconductance determined by a provided reference voltage and a provided reference current;
converting, using a power law converter circuit, the first current to a second current based on a dynamic resistance of the switching circuit;
generating a series of one or more pulses that is indicative of electrical power dissipated by a switching circuit by:
integrating the second current on a first capacitor;
comparing a voltage across the first capacitor to a second reference voltage;
generating an electrical pulse of the series of electrical pulses based on the comparison; and
generating, by a compensation circuit, the second reference voltage based on the reference current and a timing signal, the reference having a value that automatically adjusts to compensate for variation in at least one of a capacitor value, the reference current, or a cycle time of the timing signal.

18. The method of claim 17, wherein the sensing circuit comprises a shunt resistor coupled in series with the electrical circuit.

19. The method of claim 17, wherein generating the second reference voltage comprises:
integrating the reference current on a second capacitor for one or more cycles of the timing signal, a cycle of the timing signal being indicative of a unite of time for determining electrical power dissipated by a switching circuit based on the one or more pulses.

20. The method of claim 17, wherein the power law converter circuit converts the first current to a second current based on a dynamic resistance of the switching circuit by:
amplifying the first current to generate an intermediate current having an amplitude that is a selectable arithmetic power of an amplitude of the first current; and
scaling intermediate current proportional to the reference current to obtain the second current.

* * * * *